(12) United States Patent
Wilson

(10) Patent No.: US 7,010,280 B1
(45) Date of Patent: Mar. 7, 2006

(54) LINEAR RF POWER AMPLIFIER AND TRANSMITTER

(75) Inventor: Martin Paul Wilson, Caldecote (GB)

(73) Assignee: Cadence Design Systems Inc., San Jose, CA (US)

( * ) Notice: Subject to any disclaimer, the term of this patent is extended or adjusted under 35 U.S.C. 154(b) by 0 days.

(21) Appl. No.: 09/856,121

(22) PCT Filed: Nov. 19, 1999

(86) PCT No.: PCT/GB99/03864

§ 371 (c)(1),
(2), (4) Date: Dec. 21, 2001

(87) PCT Pub. No.: WO00/31881

PCT Pub. Date: Jun. 2, 2000

(30) Foreign Application Priority Data

Nov. 19, 1998 (GB) .................................... 9825414

(51) Int. Cl.
*H04B 1/04* (2006.01)

(52) U.S. Cl. .................. 455/126; 455/114.2; 330/136; 330/10

(58) Field of Classification Search ................ 455/126, 455/102, 114.2, 114.3, 127.1, 119; 330/136, 330/149, 10; 332/145, 151
See application file for complete search history.

(56) References Cited

U.S. PATENT DOCUMENTS

| 4,176,319 | A | | 11/1979 | Kahn | |
|---|---|---|---|---|---|
| 5,144,258 | A | * | 9/1992 | Nakanishi et al. | 330/129 |
| 5,430,416 | A | * | 7/1995 | Black et al. | 332/145 |
| 5,732,333 | A | * | 3/1998 | Cox et al. | 455/126 |
| 5,978,662 | A | * | 11/1999 | Swales | 455/126 |
| 6,125,266 | A | * | 9/2000 | Matero et al. | 455/126 |
| 6,240,278 | B1 | * | 5/2001 | Midya et al. | 455/126 |
| 6,430,402 | B1 | * | 8/2002 | Agahi-Kesheh | 455/115.3 |
| 6,449,465 | B1 | * | 9/2002 | Gailus et al. | 455/126 |
| 6,466,772 | B1 | * | 10/2002 | Rozenblit et al. | 455/126 |

FOREIGN PATENT DOCUMENTS

| DE | 4429535 | 2/1996 |
|---|---|---|
| GB | 2320381 | 6/1998 |

* cited by examiner

*Primary Examiner*—Edward F. Urban
*Assistant Examiner*—Blane J. Jackson
(74) *Attorney, Agent, or Firm*—Dykema Gossett PLLC

(57) ABSTRACT

A transmitter circuit means is arranged to provide linear amplification of non-constant envelope modulated RF signals by directly amplitude modulating the transmitter power amplifier with the amplitude component of the baseband signal. In addition, the signal to be transmitted is phase modulated by the In-phase and quadrature components of the baseband signal, and synchronization means are provided in order to correct any time slippage between the directly applied amplitude modulation and the phase modulation. The modulation synchronisation correction contributes significantly to the linearity of the transmitter.

18 Claims, 10 Drawing Sheets

LINEAR RF POWER AMPLIFIER AND TRANSMITTER

BACKGROUND OF THE INVENTION:

The present invention provides a linear radio frequency (RF) power amplifier which is particularly suited for amplifying a linearly modulated signal.

More particularly, the present invention provides a linear RF power amplifier and transmitter in which the polar components of the input signal are manipulated at baseband in order to correct for any non-linearities introduced within the amplifier and hence provide for increased power amplifier (PA) efficiency.

PA efficiency is a vital parameter in portable radio equipment as it directly affects talk time. Linear modulation schemes, such as QPSK or DQPSK are characterized by having a non-constant amplitude envelope, as opposed to FSK or GMSK schemes which are constant envelope. Although linear modulation schemes are more bandwidth efficient than constant envelope schemes, thus allowing more channels to be allocated within a given band, they are also more demanding of the linearity of the PA. In contrast, with constant envelope modulation schemes, the power amplifier linearity is not relevant, as the amplitude envelope of the input signal does not vary. This allows the PA to be operated at the point of maximum efficiency, although at such a point the PA response is characterised by being highly non-linear. If a non-constant modulation envelope signal were to be applied as an input signal to a PA biased to such a point, the resulting output signal would be highly distorted due to the non-linear characteristic. This distortion would lead to spreading of the PA output spectrum into the adjacent channels, therefore effectively negating any gains from the bandwidth efficiency of the linear modulation schemes.

Various solutions to fulfill the requirement of a linear output PA when using non-constant envelope modulation schemes have been previously proposed, and are well known in the art. One of the most commonly used prior art solutions is to bias the power amplifier as if it is handling a much larger signal than the transmitted signal, so that the transmitted signal is amplified linearly. This is known by those skilled in the art as "backing off", and the backoff ratio is essentially paid for in wasted battery power. As a result of this the talk time for a given output power is reduced in proportion to the backoff ratio when compared with a portable radio equipment that employs a constant envelope modulation scheme. Another resulting problem of "backing off" the output PA is the increased power dissipation in each of the output devices which increases both the cost and the difficulty of integrating transmitter circuitry into an integrated circuit.

A further known prior art scheme is the use of a technique called feedforward amplification. This subtracts a scaled down version of the power amplifier output from the power amplifier input in such a manner that the wanted signal is cancelled and the distortion generating error signal remains. The error signal is then amplified and combined with the PA output in such a manner that the PA distortion is cancelled. This has the effect of raising efficiency but requires the use of power hybrid combiner and delay lines which cannot be integrated onto silicon and also contribute to power loss. Furthermore, such a system relies on cancellation and therefore is prone to drift, and must be corrected adaptively. One method of achieving this is the use of pilot tones, as previously described in U.S. Pat. No. 3,922,617 "Adaptive feedforward system", W. R. Denniston R. F. Hertz, NY 1975. However, care has to be taken to avoid spurious problems in an integrated transmitter, extra complication is introduced by adding more local oscillators, and the presence of discrete narrowband tones may create an interference problems in wideband communications channels. Another drawback is the increased alignment and test time which will increase cost over an equivalent constant envelope transmitter.

A third prior art method is envelope feedback. In this method, the input signal is resolved into its amplitude and phase components. FIG. 1 shows a block diagram of a prior art linear transmitter employing envelope feedback, as originally disclosed in U.S. Pat. No. 5,430,416 "Power amplifier having nested amplitude modulation controller and phase modulation controller" Black et al. 1994. In this case the amplitude component (r) of the signal is applied to the PA (1001) to amplitude modulate (AM) the PA output, by means of a closed loop around an envelope detector (1003). For the modulation of the phase component (8), a phase locked loop (1005) is used to provide the phase modulation (PM) means, and this also corrects for any incidental PM introduced by the AM modulator. Correction of incidental PM introduced in the PA is most commonly achieved by means of modulation of the divide ratios in a fractional N synthesizer.

An envelope feedback linear transmitter as in the described prior art has one advantage that almost all of the functional blocks can be incorporated into an integrated circuit (IC). there are, however, a number of disadvantages of such an arrangement, particularly when high modulation rates are required, wherein the arrangement becomes particularly unsuitable. Furthermore, the system requirements for an envelope feedback linear transmitter which could work with high modulation rates are harsh. A number of the disadvantages together with explanations of the requirements for operation at a high modulation rate are given below:

1) In order to operate effectively with high modulation rates, a closed loop amplitude control around the envelope detector would be required with a very fast response time.
2) The fractional-N phase locked loop (PLL) would have to cope with very high speed phase reversals in the modulation.
3) There is no facility for controlling time slippage between the AM and PM modulation means.
4) The use of a large divider in the PLL would result in adjacent channel interference due to synthesizer phase noise and hence will increase the likelihood of spurious signal generation.

Inadequacies in any of the above would be manifested as unwanted adjacent channel sidebands. U.S. Pat. No. 5,732,333 "Linear transmitter using predistortion" Cox et al, 1998 discloses a technique for overcoming these problems in which an IQ coherent downconversion to baseband using the receiver A/Ds is undertaken. The demodulated signal is then compared with the transmitted signal and the appropriate corrections are made. The problems with this technique are that extra processing is required to keep the two signals coherent, and extra local oscillators are required. Furthermore, there is also a risk of introducing unwanted signals at the transmitter output by the downconverter, and extra A/Ds are required for a full duplex system.

The present invention improves upon all of the previously described prior art by making use of one of the properties of an amplifier that is operating at the point of maximum efficiency. As already described, a conventional RF power amplifier must be "backed off" from the point of maximum efficiency else there will be no linear relationship of the output signal with the input signal. However, an amplifier which is operating at maximum efficiency (i.e. a heavily compressed amplifier), whilst having nonlinear input/output characteristics, will also have a nearly linear and predictable amplitude response in relation to its power supply. If an input linear signal is therefore split into its amplitude and phase components, a faithful recreation of the signal's amplitude response can be achieved by means of the power supply voltage. Although, phase errors will remain with such a direct modulation method, these can be corrected by means of small signal circuits. The whole essence of this means of modulation is to force the power amplifier to operate in its mode of maximum efficiency, with the linearity been determined by small signal components. In this way the linearity of the transmitter is determined by small signal circuits which have more readily determined properties, and which can achieve linearity with much less power.

In order to implement the above modulation scheme, according to the present invention there is provided a linear RF transmitter for the transmission of non-constant envelope modulated signals, comprising:

baseband processing means arranged to resolve an input signal into phase components, and to further resolve the phase components into Inphase (I) and quadrature (Q) components;

conversion means arranged to generate analogue representations of the signal components;

phase modulation means arranged to receive the analogue representations of the In-phase and quadrature components and to upconvert and phase modulate the I and Q components into an RF signal;

output power amplifier means arranged to receive the phase modulated RF signal and amplify the signal for transmission;

direct amplitude modulation means arranged to receive an amplitude component of the input signal and to control the output power amplifier means in accordance with the amplitude component whereby to amplitude modulate the RF signal; and synchronising means arranged to monitor the RF signal and control the conversion means in response to the RF signal.

From one aspect, the present invention can be arranged to resolve the input signal into both phase and amplitude components at baseband, wherein the amplitude component is then converted to analogue in the conversion means and then fed directly to the amplitude modulation means.

From another aspect, the present invention is arranged to resolve only the phase component from the input signal at baseband. The phase components are then used to phase modulate an intermediate frequency signal and this modulated intermediate frequency signal is applied to an envelope detector and limiter from which an analogue amplitude component of the signal is extracted. The analogue amplitude component is then fed to the amplitude modulation means.

Further, the present invention is particularly adapted to ensure synchronisation between the amplitude modulation and phase modulation, by correcting any time slippage therebetween, and various synchronising means are provided to achieve this. This correction has the effect of removing any errors in the modulation synchronisation introduced by various factors in the system components such as limited bandwidth, and hence contributes to the linearity of the transmitter as a whole.

The present invention has an advantage in that it allows for a maximum level of transmitter integration onto an IC.

Furthermore, the present invention provides a linear PA with a sufficiently linear characteristic so that a non-constant envelope modulation scheme may be used with comparable power efficiency to a constant envelope transmitter circuits.

There is also the further feature and advantage in that the arrangement provided by the present invention does not require any extra local oscillators or analogue to digital converters. This contributes to the previous advantage of maximum integration onto silicon.

As an additional advantage, the arrangement provided by the present invention does not generate any extra signals in the output stage of the transmitter. As a result of this, screening requirements are reduced and spurious problems are minimised. Furthermore, spectral spreading is also reduced and bandwidth efficiency may be increased.

Finally, the present invention allows a for a degree of self-alignment. This reduces the time required to test the circuit and hence reduces the cost over equivalent non-constant envelope transmitters.

BRIEF DESCRIPTION OF THE DRAWINGS

Further features and advantages of the present invention will become readily apparent from the following description of particularly preferred embodiments thereof, presented by way of example only, and in particular by reference to the accompanying drawings, wherein.

Figure 1:
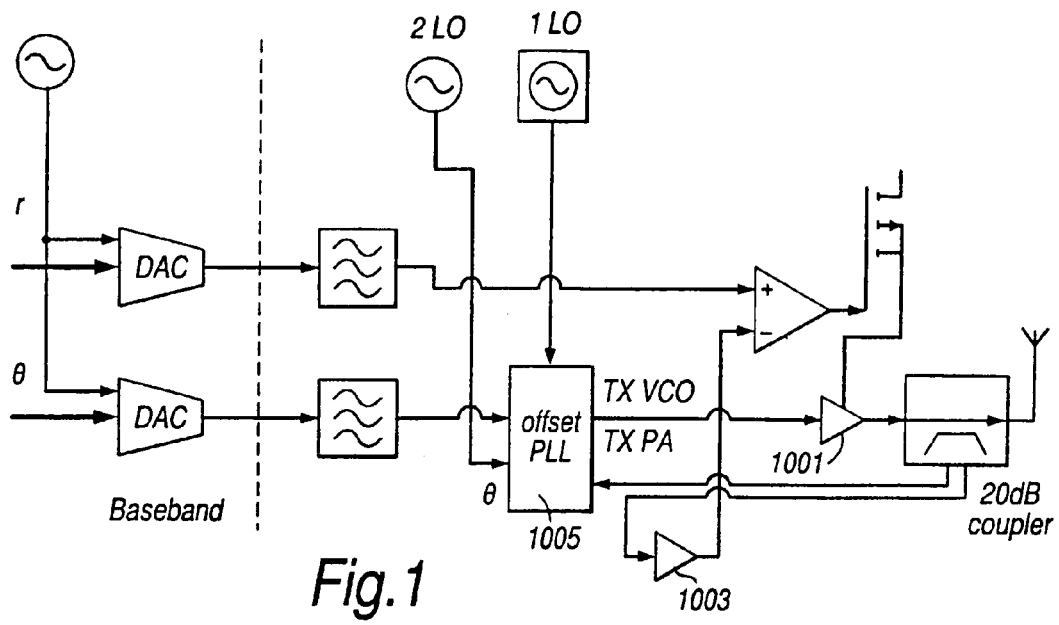
FIG. 1 shows one of the previously described prior art linear transmitters.

Please note that in the drawings a box consisting of dash lines or dot-dash lines which surrounds various components indicates the limits of those components which can be integrated on to an integrated circuit. That is, all components inside the box (es) can be integrated onto an IC.

Figure 2:
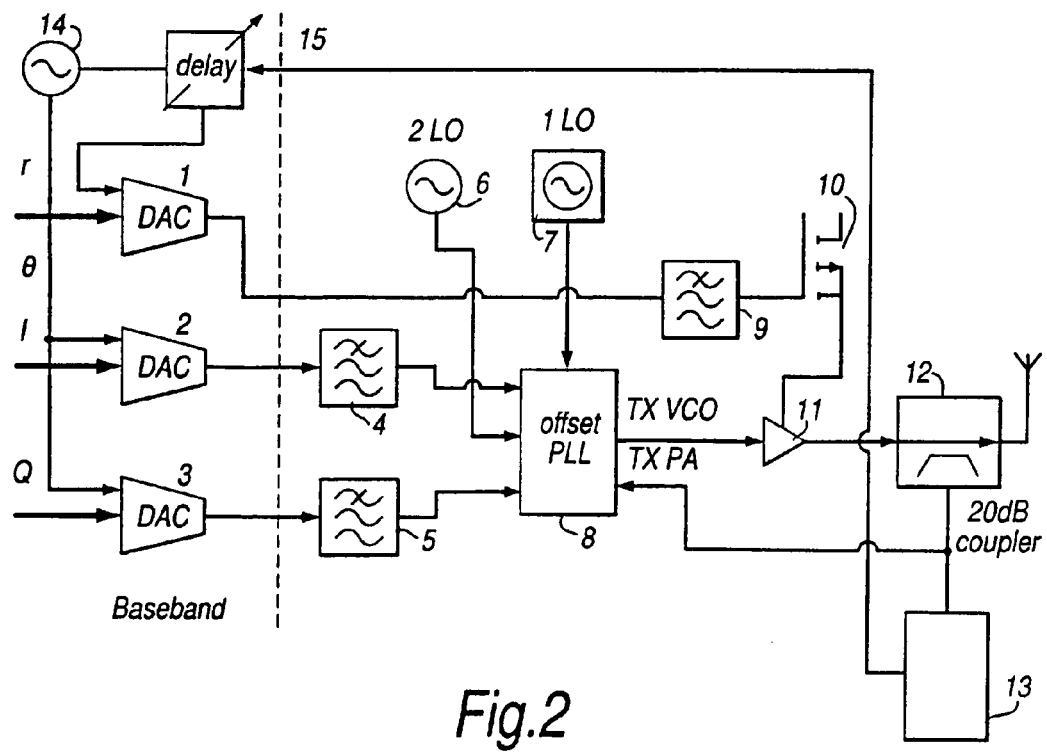
FIG. 2 is a block diagram of a complete transmitter in accordance with the present invention.

DESCRIPTION OF THE INVENTION:

With reference to FIG. 2, a first preferred embodiment of the present invention will now be described.

FIG. 2 shows a block diagram of a linear PA and transmitter arrangement according to the present invention. The baseband processor of the transmitter resolves the signal into amplitude (r) and phase components (θ). The phase component (θ) is then further resolved into its in phase (I) and quadrature (Q components, wherein:

$I = \cos(\theta)$; and $Q = \sin(\theta)$.

The resolution of the input signal into its amplitude r and In-phase and quadrature components I and Q takes place at baseband before upconversion.

The baseband output is connected to DACs 1, 2 and 3 DAC 1 converts the amplitude representation of the signal, whereas DACs 2 and 3 are used to provide a phase representation of the signal. The DACs are provided with a clock signal from an oscillator 14. The respective I and Q signals output from the DACs are then interpolated with filters 4 and 5 and subsequently used to control an IQ modulator placed within the upconversion phase lock loop (PLL) 8. The amplitude component r is converted to analogue in DAC 1 and is then output to an interpolation filter 9 from the baseband IC. The output of the interpolation filter 9 is then used to directly modulate the power amplifier 11 by means of voltage adjustment means 10 to provide for amplitude modulation of the output signal. Phase modulation is achieved by means of the upconversion PLL 8 placed before the power amplifier 11. Direct Modulation of the output of the final power amplifier in the transmitter is used in the present invention for maximum efficiency.

The first local oscillator 7 is derived by means of a synthesizer, and is used as a reference for the transmitter. The second local oscillator 6 is used to generate the intermediate frequency (IF). The feedback to the PLL 8 is taken from the PLL output in order to remove the phase modulation generated incidentally from the amplitude modulation of the PA. A synchronization means 13 is used to ensure the amplitude modulation is applied synchronously with the phase modulation by changing the timing of the clock 14 fed to the DACs 1,2, and 3 by means of delay (15). This enables fine control of the digital to analogue conversion process, and hence the synchronicity of the amplitude and phase signal can be maintained. The synchronous application of both amplitude modulation and phase modulation is vital to ensuring the successful embodiment of a linear high data rate transmitter, and this aspect constitutes one of the most important aspects of the present invention. The operation of the synchroniser 13 will be explained in more detail later.

Details will now be given of the upconversion PLL 8. The IQ upconversion loop 8 can be implemented in many different forms, and a number of different arrangements will now be described, all of which may be used within the linear transmitter of the present invention.

Figure 3:
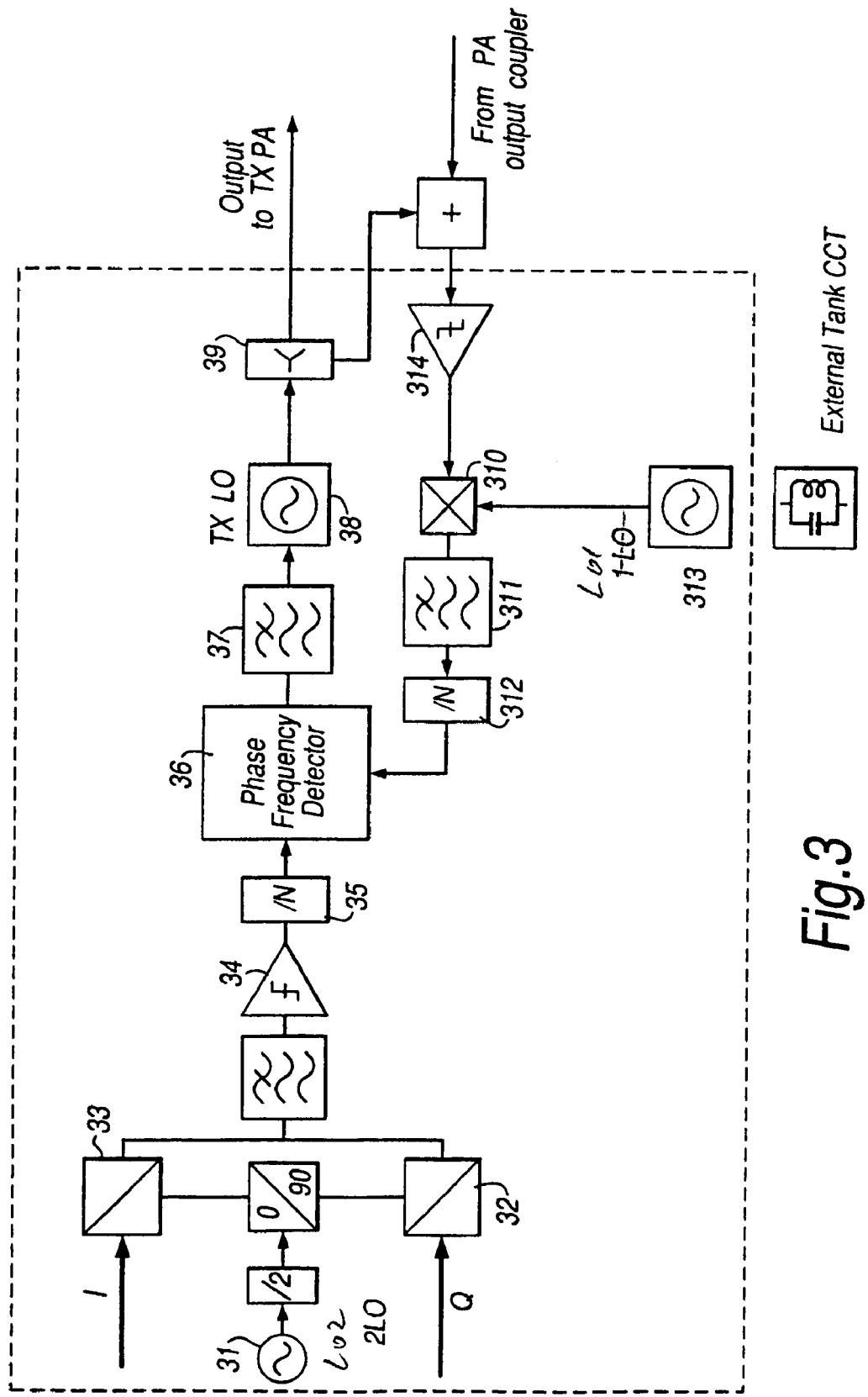
FIG. 3 is a block diagram of one of the arrangements for a PLL upconversion loop used within the present invention.

A first implementation is shown in FIG. 3. In FIG. 3 the dot-dash box shows the limit of on-IC components.

In FIG. 3, the baseband I and Q components are received into IQ modulation means comprising mixers 32 and 33 which mix the components with a reference frequency LO2 generated by oscillator 31. The modulation means 32 and 33 then feed a combined mixed output into a filter, and then to a limiter 34. The output of the limiter 34 is fed to a divider 35 and from there into a phase frequency detector 36. The phase frequency detector 36 provides an output to a loop filter 37 which is arranged to control a transmitter voltage control oscillator 38. The voltage control oscillator 38 provides an RF output to a splitter 39 which provides a first output to the transmitter power amplifier, and a second output which is fed back to the phase frequency detector by means of a limiter 314. The output of the limiter 314 is mixed with a further reference frequency LO1 generated by an oscillator 313 in a mixer 310, the output of the mixer then being filtered by a filter 311. The output of the filter 311 is then fed through a second divider 312, the output of which is referred to the phase frequency detector as another input.

In operation, the loop gives a modulated output at the sum of the IF at frequency LO2 (31) and the reference frequency at LO1 (313). In this the IF is modulated by IQ modulator 32. The RF voltage controlled oscillator (VCO) 38 is downconverted by mixer 311 and phase locked by means of phase detector 36 to the modulated IF. By this means the modulated signal is transferred through the loop to the VCO. For high data rate systems, the PLL as a whole must be wideband to avoid any lag due to the PLL response. Although some of this lag will be reduced by the synchronizer 13, described in detail below, the loop will be stressed creating phase errors that will result in spectral regrowth.

Figure 4:
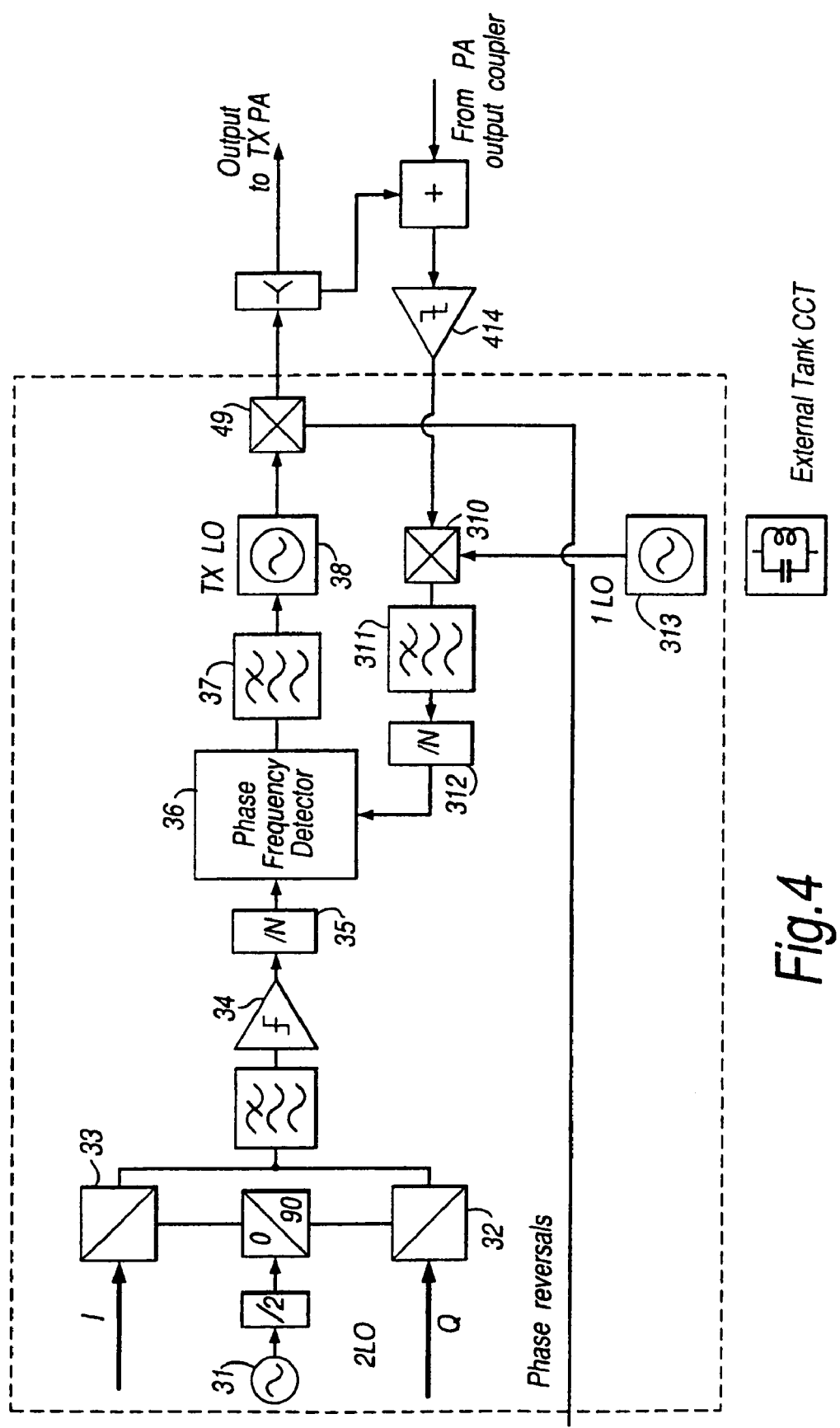
FIG. 4 is a block diagram of another arrangement for a PLL with chopper to accommodate phase reversals which may also be used within the present invention.

To overcome this limitation, and improve upon the basic design, various additional features will be described which may be used with the basic PLL arrangement FIG. 4 describes an offset PLL configured exactly as in FIG. 3 but with a chopper (binary modulator) 49 added at the VCO output. This is controlled by the baseband IC and acts to remove the worst case 180 degree phase transitions from within the PLL.

The drawback is that the 90 degree transitions will still occur within the loop and may result in distortion. However, one possible arrangement is the use of the PLL with chopper as a phase interpolation filter. In this case, the I and Q signals are applied directly from the DACs, to the modulator mixer 32, and the PLL interpolates between phase states. This arrangement may be used adjacent band spectral requirements or not particularly severe.

Figure 5:
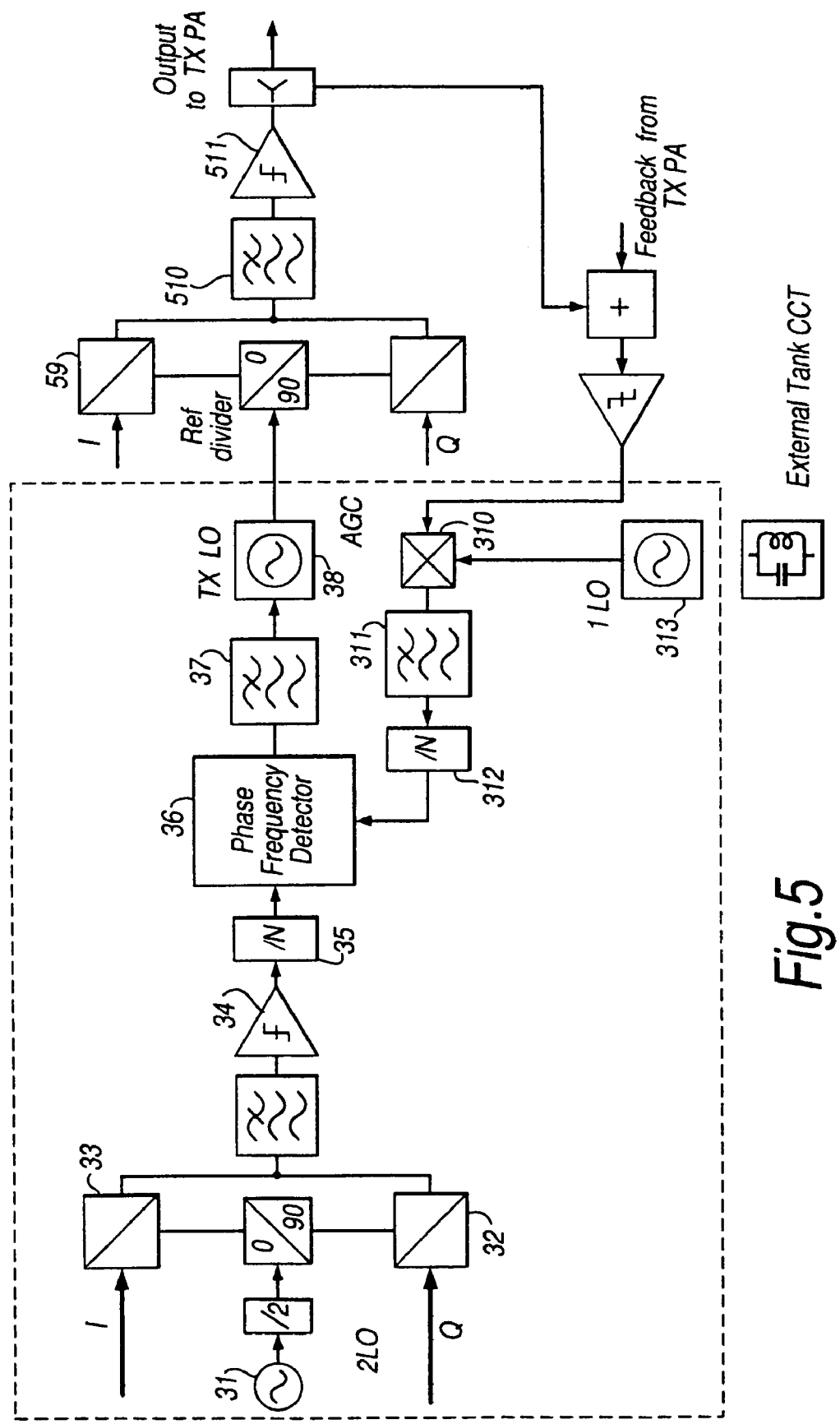
FIG. 5 is a block diagram of a further arrangement for a PLL with dual point modulation to isolate modulation from the PLL response which may also be used within the present invention.

A further improvement is shown in FIG. 5. Herein a second modulator 59 has been added at the output comprising mixers, a filter 510 and a limiter 511. The I and Q signal are fed to the modulator 59 directly, the modulator 59 being placed after the VCO and before the output to the PA. The modulator acts to detect and remove 90 degree phase transitions by reference to the directly-fed I and Q signals. Although the modulator will have to be operated at high frequency, the modulation is not required to be accurate, the aim being simply to remove most of the modulation from within the PLL. However, the second modulation must be accurately synchronised with the first modulator, and a suitable synchronisation means for performing this is described below.

Figure 6:
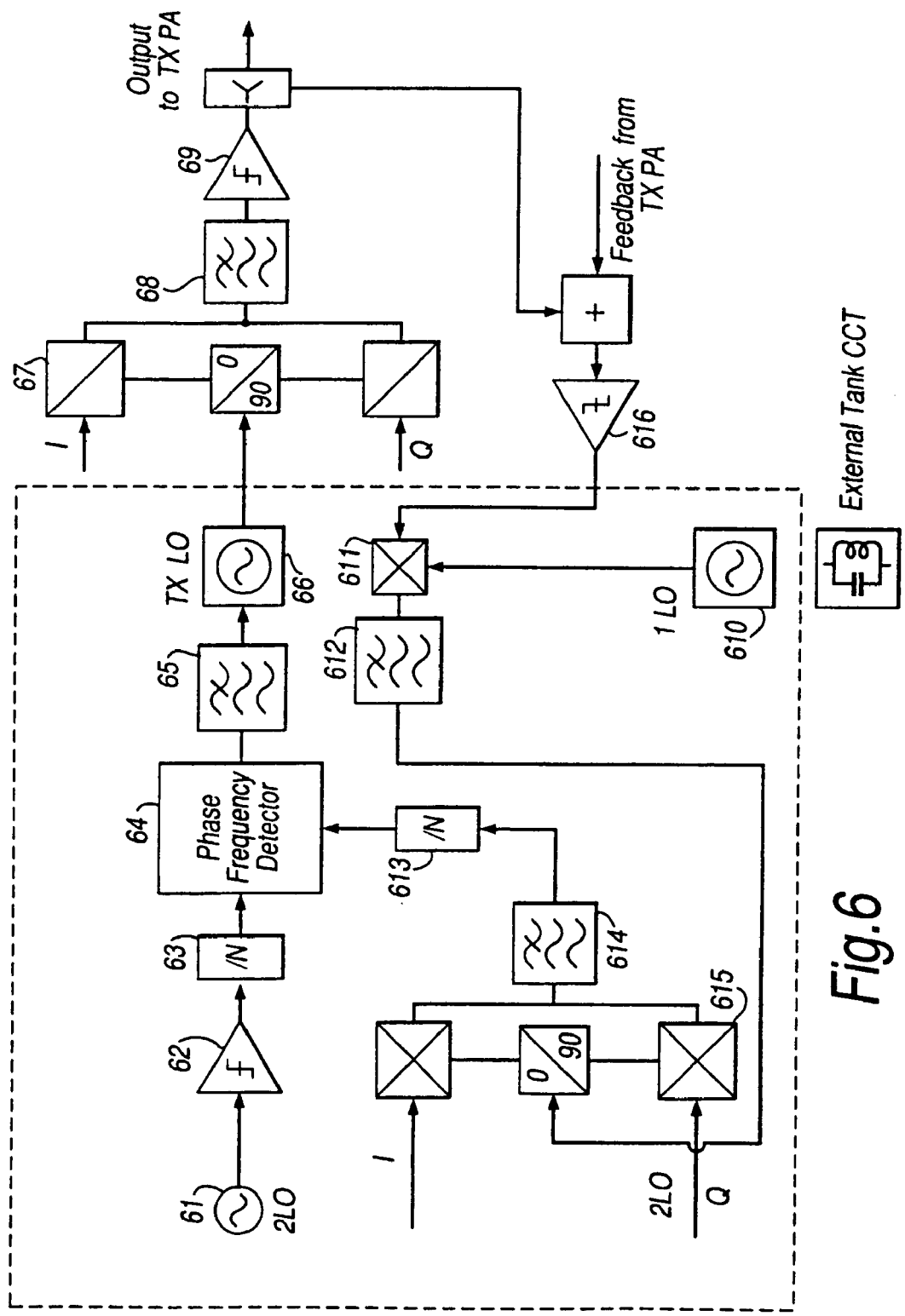
FIG. 6 shows an alternative arrangement for a PLL with dual point modulation.

FIG. 6 shows an alternative arrangement to that of FIG. 5 wherein an accurate IQ modulator 615 is placed at the feedback input to the phase detector.

In FIG. 6, the reference frequency LO2 generated by the oscillator 61 is referred direct to the phase frequency detector 64 by means of the limiter 62 and divider 63. The phase detector 64 outputs a voltage control signal via loop filter 65 to the voltage controlled oscillator 66. The voltage controlled oscillator 66 outputs an RF signal which is fed to a further IQ modulation means comprising the mixers 67, a filter 68, and a limiter 69. The output of these modulation means is then fed via a signal splitter to the transmitter power amplifier. The signal splitter also provides the output signal to a summer which sums the output signal with feedback from the transmitter power amplifier and then passes the resultant signal to a limiter 616, and thence to the mixer 611 wherein it is mixed with reference frequency LO1 from oscillator 610. The output of the mixer 611 is then high pass filtered in filter 612 before being referred to the accurate IQ modulator 615 placed in the feedback path to the phase detector. The IQ modulator 615 outputs a phase modulated signal to the phase frequency detector 64 through the filter 614 and divider 613. For accurate operation the sign of the Q signal fed directly to the modulator 615 should be opposite to that of the VCO modulator to enable phase cancellation at the PLL.

Figure 7:
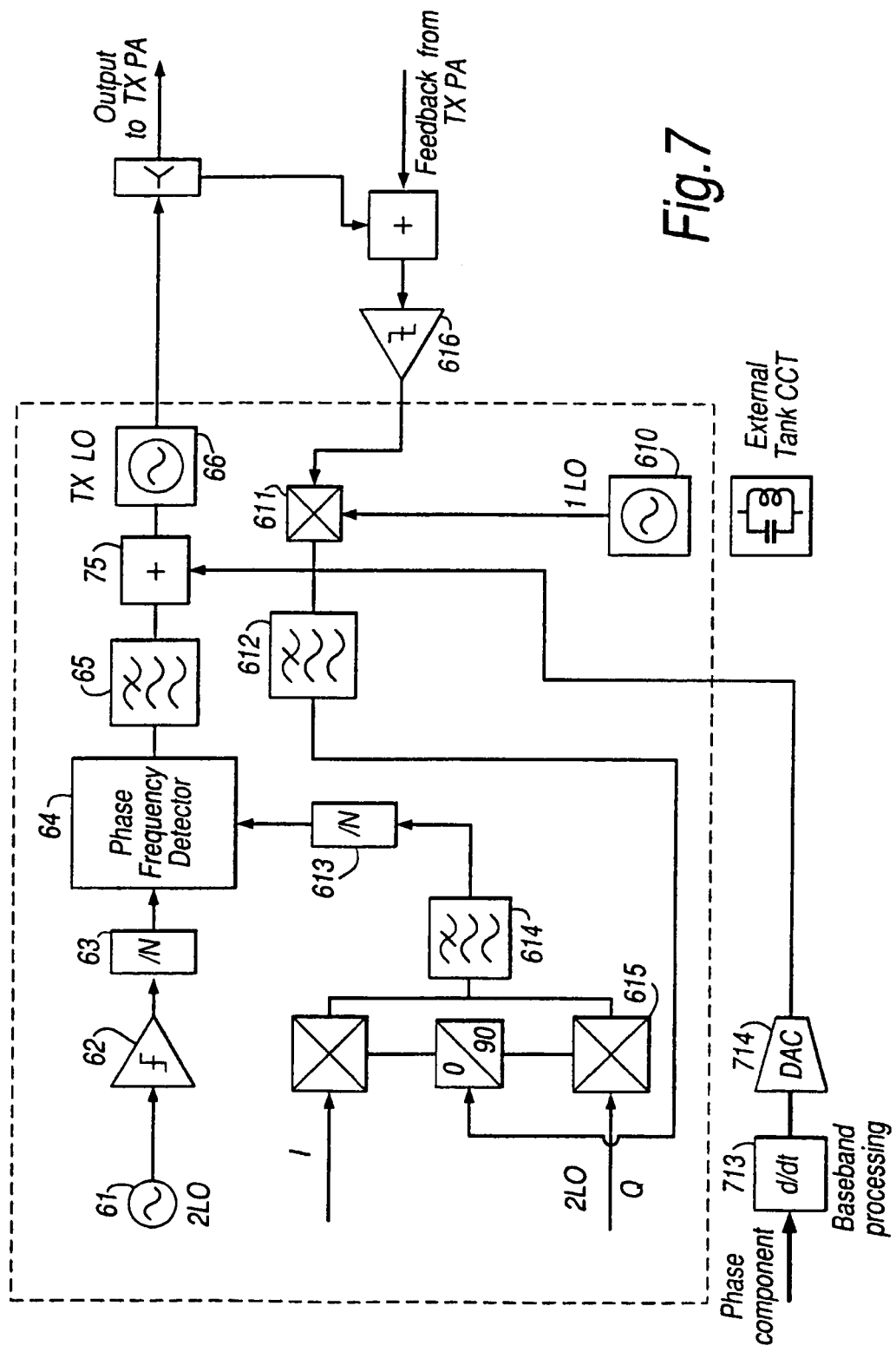
FIG. 7 depicts a further arrangement of a PLL in accordance with the present invention which uses frequency modulation of a Voltage Controlled Oscillator (VCO) to achieve a second modulation point.

FIG. 7 shows a further configuration similar to FIG. 6 whereby the VCO 66 is frequency modulated by the differentiated phase signal obtained from a differentiator 713 and subsequent DAC 714. The differentiator 713 and DAC 714 process the phase signal at baseband. The frequency modulation is achieved by summing in the summer 75 at the output of the loop filter 65. This removes the requirement for a modulator after the VCO 66, therefore improving the signal to noise ratio at the input to the PA. However the effectiveness of the cancellation will depend upon the loop gain variation of the VCO 66. The phase modulator can either be after the second local oscillator or be placed in the feedback path of the PLL. Alternatively, the divider 613 can be a fractional N delta sigma modulator incorporating phase control.

Having described how the phase modulation is achieved in the upconversion loop 8, a detailed description of the direct amplitude modulation of the output amplifier 11 of FIG. 2 will now be made.

There are 2 possible methods for effective amplitude modulation: open loop and closed loop. The open loop relies on there being a known repeatable relationship between the supply on the output devices and the available output voltage swing. The closed loop relies on repeatable properties of the RF detector.

The open loop method applies a signal to a voltage control device. A voltage feedback loop can be used to ensure an identical voltage to the DAC output is applied to the PA. As the supply to the output devices is reduced, the available voltage swing to the output reduces, and consequently the output power. Due to this limited swing, the output power is approximately proportional to the square of the control voltage. If this characteristic is repeatable, a conversion table can be used in the baseband IC to ensure there is an exact square law relationship between modulation voltage and output power. The advantages of this are that higher control speeds can be achieved than with the closed loop method, the spreads in RF detector envelope can be tolerated. Thus this technique is ideal for high rate modulation schemes.

A closed loop arrangement is possible, but there will be a problem in obtaining a fast enough response time for high data rate modulations. The closed loop method relies on an RF detector to provide feedback of the output level. A high speed servo loop can then be closed around the output stage. Control of the output power can be achieved either through changing the output device voltage as in the open loop case or the output device bias level. Care must be taken with the closed loop characteristic in that the controlled device does not cut off or saturate, otherwise the control loop will open resulting in a catastrophic degradation of the output spectrum. For this reason the clip level detector is required on the output of the control amplifier which reduces the input amplitude control level if saturation occurs. Saturation can be detected by a sudden increase in control voltage within the loop.

Although the baseband modulation is band limited by the premodulation filters in the baseband IC, unfortunately, the separated phase and amplitude components are not. Therefore a large oversampling ratio would be required al the baseband IC. In order to overcome this problem, the following solutions may be employed:

a) Direct application of sampled baseband signal to PLL and use the PLL as an interpolator.
b) Predistortion of baseband signal to compensate for interpolation filter/sampling.
c) Use of baseband composite IQ signals and limiter.
d) The separate I and Q phase components at baseband are partially modulated with the amplitude signal. The phase component signals then become:

$$I = (am\ (1-\sigma X) + \sigma) \cos \theta$$

and $$Q = (am\ (1-\sigma) + \sigma) \sin \theta$$

wherein the (am $(1-\sigma)+\sigma$) term arises from the amplitude modulation, $\sigma$ being variable to compensate for limited bandwidth, as described below.

The direct application of the sampled baseband signal to the PLL has already been discussed above. With respect to the solutions b), c), and d), the following is presented.

Solution b) (pre-distortion of baseband signals) uses the baseband signal processor to predistort the I and Q signals, so that the errors dues to sampling and anti aliasing are precompensated for, thereby reducing the net error after filtering.

Solution c), on the other hand, (use of baseband composite IQ signals) proposes that instead of resolving the signal into amplitude and phase, and outputting the phase as a constant envelope signal, the I and Q components are in fact made to be the Cartesian components of the bandlimited baseband signal. Since this is a bandlimited signal, a low oversampling rate and anti-aliasing signal can be used in the baseband. After this, the signal is then modulated in the analogue section of the circuit, thus avoiding problems due to limited oversampling, the phase component can be extracted by means of a limiter.

With solution d), in order to reduce the dynamic range of the signal at the limiter and therefore increase the signal to noise ratio, some amplitude compression of the I Q signal can be used in the baseband IC. The precise modulation to be applied was described in the previous equations for solution d). The amplitude compression is thus achieved by making by making the variable a in the above equations a small fraction such that a compromise can be achieved between baseband bandwidth and the limiter dynamic range.

A discussion of those aspects of the present invention relating to power control efficiency will now be undertaken.

In order to achieve the stated advantage of similar power efficiency as that of a constant envelope transmitter, it would be necessary to avoid power loss in the amplitude modulating section of the transmitter. One method of achieving this is to modulate the bias control to the output stage. This can be achieved with either closed loop method, but the open loop bias control is not repeatable. Since the use of closed loop modulation is not always desirable, some other method of achieving efficiency is required.

With the open loop method, power reduction is achieved by means of a voltage drop across the series pass device in the amplitude modulator. Unfortunately this voltage drop represents a loss of power. In order to overcome some of this power loss, two different arrangements either of which may be used within the present invention will be presented.

Figure 8:
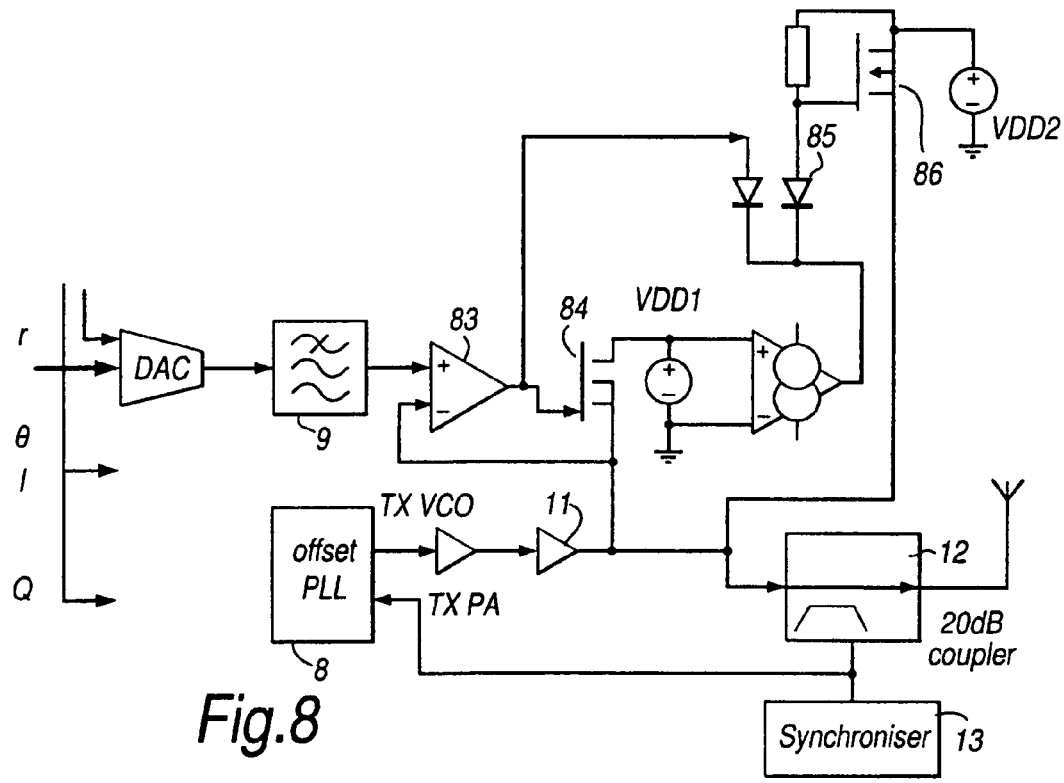
FIG. 8 shows a first means of power efficient amplitude modulation used within the present invention.

A first power economy means is presented in FIG. 8. Herein, a second reduced level power rail is included that can be generated by means of an efficient switched mode converter. Two series pass devices 84 and 86 are used each in series with its own supply, and the voltage control loop closed around both devices. The control means is arranged so that at mean power level, the lower supply voltage series pass device 84 is passing most of the current, and a small voltage drop occurs across this device. When an amplitude peak occurs, this device cuts off, and the switching means 85 results in series pass device 86 from the higher voltage supply taking over. FIG. 8 includes an example of suitable switching means, being the two diodes 85, to enable this. Alternatively the higher supply voltage could be enabled directly from the baseband IC.

Figure 9:
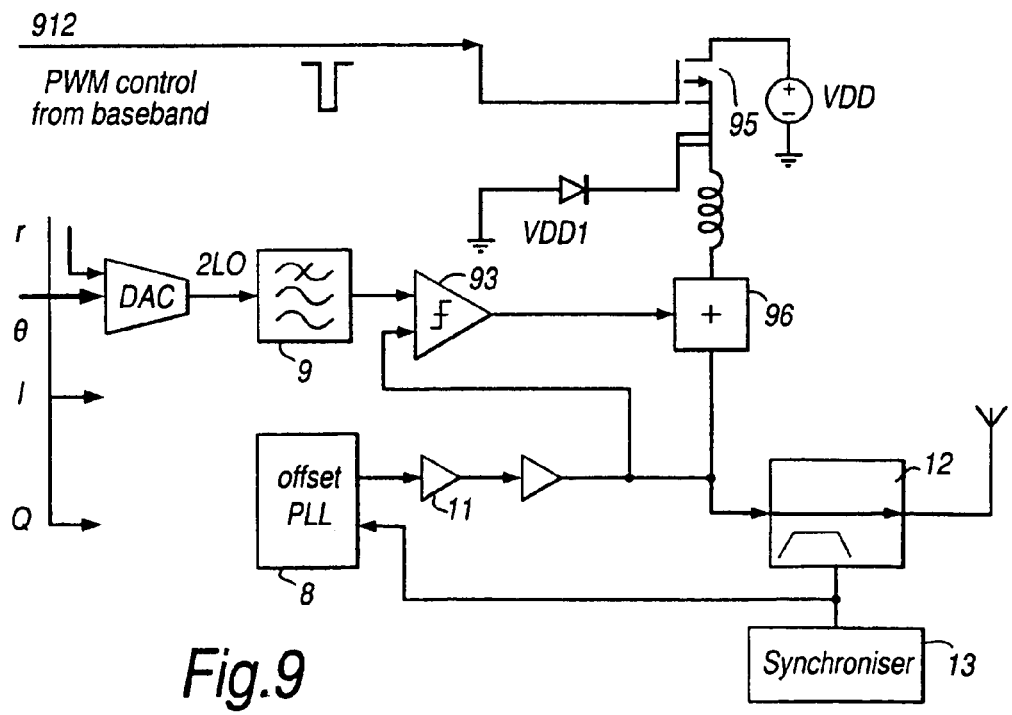
FIG. 9 depicts a second means of power efficient amplitude modulation.

A second power economy means is illustrated in FIG. 9. In this case, the switched mode converter is dispensed with and switch mode function is essentially built into the series pass controller 95 by virtue of PWM control from baseband. The series pass device is switched fully on for a period determined by the baseband chip by means of a control line 912. The resulting voltage pulse is integrated by an inductor, any error being corrected by means of a voltage feedback amplifier 93 that can provide fine correction through the adder 96.

The switching circuit is shown in FIG. 9 simplified for illustrative purposes. By pulse switching the series pass transistor 95 less power dissipation occurs, therefore resulting in greater transmitter efficiency.

As stated earlier, some means of synchronizing the AM and PM components of the modulation process is essential for high data rate modulation, and this constitutes one of the most important aspects of the present invention. Synchronisation is performed by a synchronizer to be described in the following text.

Figure 10:
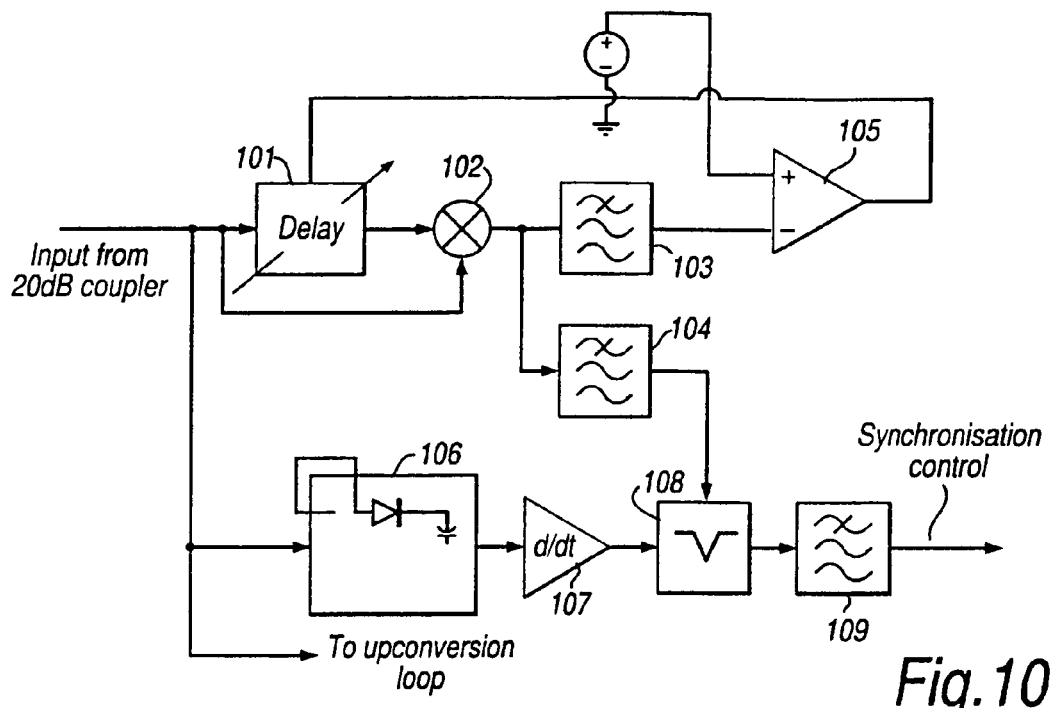
FIG. 10 is a block diagram of the modulation synchronization means of the present invention.

Operation of the synchronizer relies on the fact that the amplitude minima of the amplitude envelope coincides with a change of phase state. A block diagram of the synchronizer is given in FIG. 10. This performs a combined AM and FM detection of the transmitted signal. The transmitter output is applied firstly to an FM discriminator comprising a variable delay 101 and a mixer 102. The output of the discriminator is fed to 2 low pass filters (103 and 104). The first filter 103 is a long time constant filter. The output of this is fed into a comparator 105 which through adjustment of delay 101 results in the maintenance of a fixed DC level at output of mixer 102. The discriminator output is connected to short time constant filter 104, which removes the twice frequency component from the mixer output. After filter 104, the FM discriminator outputs a pulse whenever a phase transition occurs. The delay 101 would be implemented in an IC by means of cascaded RC networks, and the delay varied by means of adjustment means of cascaded RC networks, and the delay varied by means of adjustment of the source impedance of some of the cascades. The function of the servo loop is to maintain a phase offset at the detector, so that a phase change can be detected. Alternatively another mixer in phase quadrature can be used to drive the servo loop.

In addition to being connected to the FM discriminator, the transmitter output signal is also connected to envelope detector 106. The output of the envelope detector is connected to differentiator 107, wherein it is differentiated in order to find the amplitude minima. Around the minimum point the amplitude derivative changes sign, if the derivative is sampled by the discriminator pulse with sampler 108, then a control signal is obtained that can be used to dynamically trim the timing of the amplitude modulation signal with respect to the phase modulation signal. Accuracy of any of the detectors is not critical.

Dynamic trimming of the amplitude modulation with respect to the phase modulation is achieved by control of a delay applied to the clock signal fed to the DACs. Such control allows the phase and the amplitude of the I and Q components and the amplitude components to be controlled.

All functional blocks within the synchroniser are capable of being included within an IC. Non coherent techniques are used for simplicity and to reduce the risk of spectral contamination of the PA output.

As well as the synchronising means described above which are used in each variation of the present invention, further specific synchronising means are required where the PLL is of the dual modulation type as shown in FIGS. 5 and 6, and as previously described. Such further specific synchronising means will be described with reference to FIGS. 12 and 13.

Figure 12:
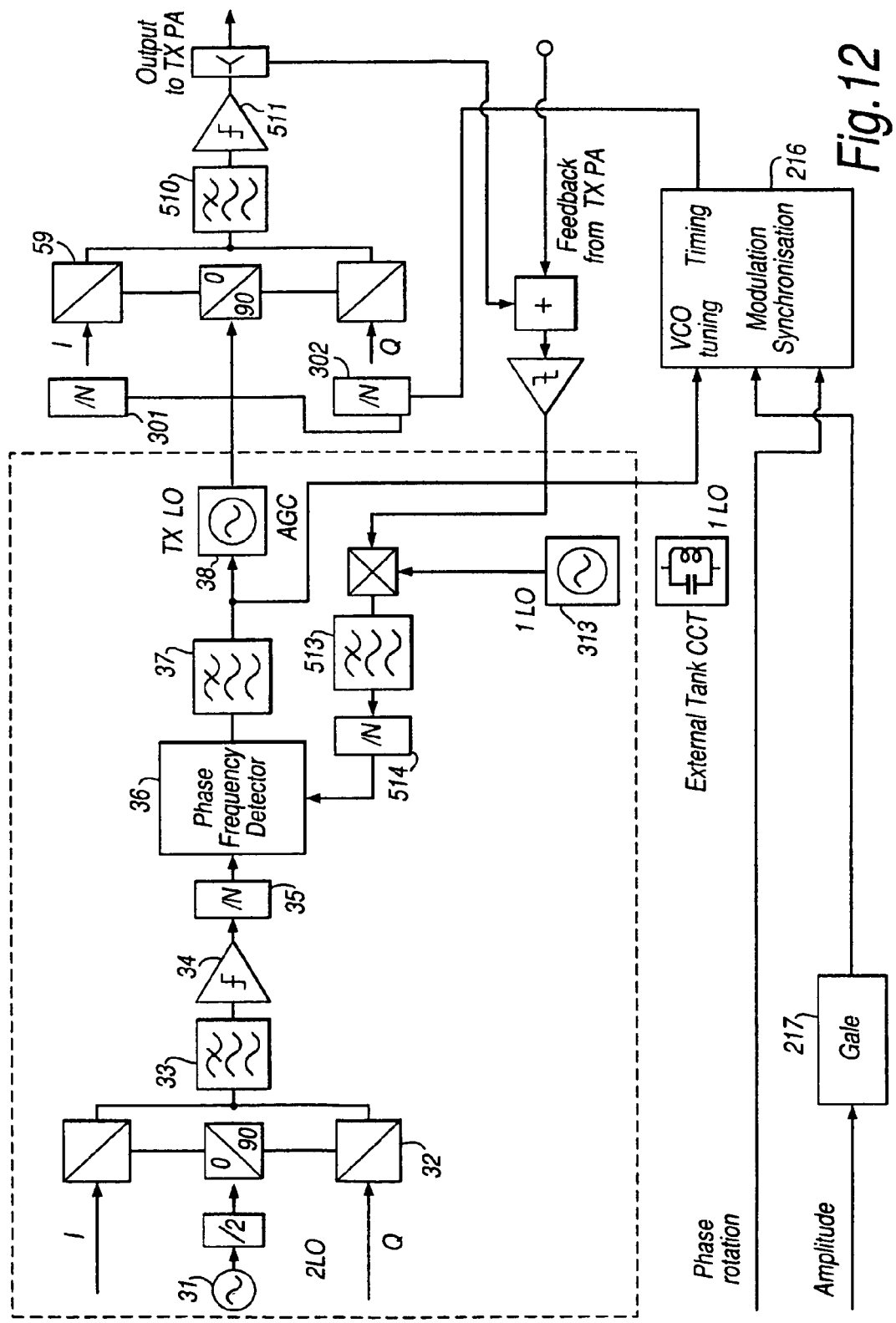
FIG. 12 shows a block diagram of the dual phase modulation loop of FIG. 5 with additional modulation synchronisation.

Herein, where two independent phase modulators 32 and 59 are employed as shown in FIG. 12 (see also FIG. 5 and the earlier description thereto) timing offsets between the modulators will result in errors that contain spectral components above the loop bandwidth of the PLL. The PLL will not, therefore, reduce the contribution of these errors to the overall system phase error and hence an additional timing adjustment is required. This additional timing adjustment is provided by the further PM specific modulation synchronisation means 216.

The aim of the timing adjustment is to adjust the timing of the signals applied to the post VCO modulator 59 to provide synchronism with the reference modulator 32. This is accomplished by means of three signals:

1) An amplitude gating signal;
2) A phase rotation direction signal (from baseband TC); and
3) A PLL frequency error signal.

The amplitude gating signal is set to be active high at the very lowest points of the AM modulation signal (for example 0.05 of peak level). The signal is then active low for all other AM outputs, The phase rotation signal from the baseband IC is held high for a positive phase rotation and low for a negative phase rotation.

The PLL frequency error signal is an AC coupled version of the VCO tuning control voltage. Derivation of the three signals can be seen by reference to FIG. 12, showing how the PM specific modulation synchronising means 216 are connected to the two point modulated PLL.

As will be seen, the VCO tuning voltage is extracted from the output of the loop filter 37 prior to the input of the VCO 38. The phase rotation signal is applied direct from the baseband IC, and the amplitude gate signal is derived from the amplitude control signal applied direct to the PA, as described previously. The phase rotation signal is converted to bipolar being signals of coefficient −1 and 1 rather than 0 and 1. The amplitude control signal is gated at gate means 217 prior to input to the PM specific synchronising means. The baseband IC processor further contains means to provide the phase rotation signal with the properties described previously.

Figure 13:
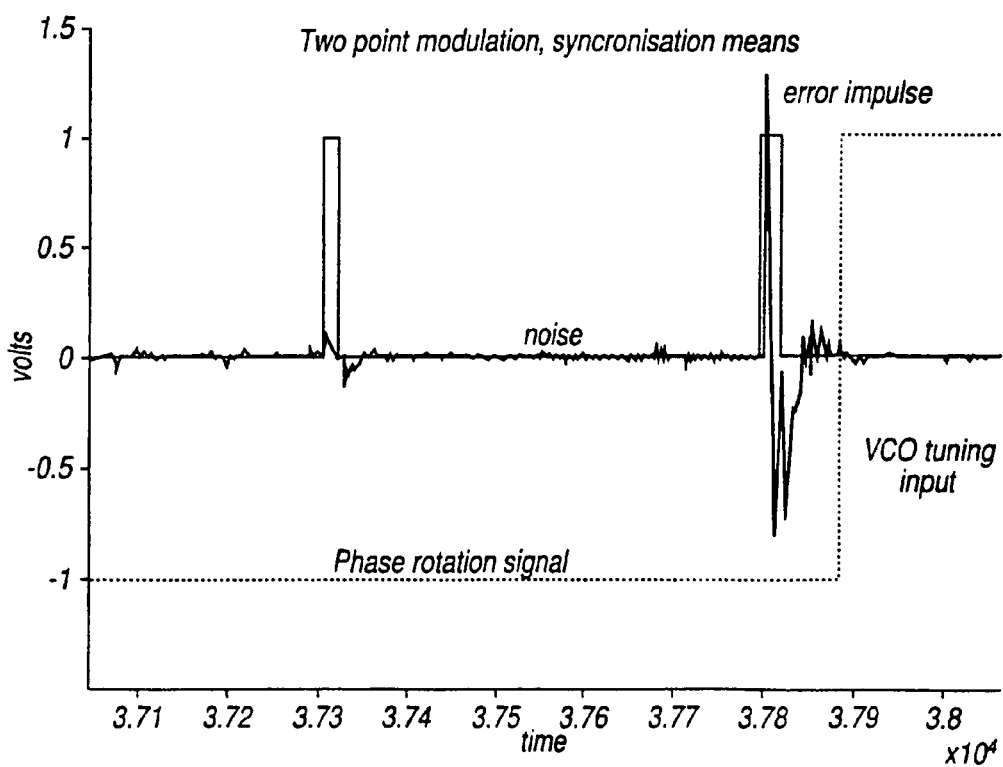
FIG. 13 is a trace demonstrating the function of the synchroniser of FIG. 12.

The function of the synchroniser can be observed by reference to FIG. 13. Herein the VCO tuning control voltage is shown containing various frequency impulses due to offsets in the modulation as well as white noise originating in the phase detectors and dividers of the PLL. The amplitude gating signal is also shown, being active high only at the lowest points of the AM modulation signal, resulting in a pulse. The phase rotation signal from the baseband IC is also shown.

The synchroniser operates by multiplying the VCO tuning control voltage with the amplitude gate signal. As the modulation offset frequency impulses contained within the VCO tuning signal are generated at each phase change in the modulation, there is a strong correlation with the pulse of the amplitude gate signal, and an error impulse is produced from the multiplication, as shown. Since the error impulses are thus correlated with the amplitude gate signal whilst the white noise remains uncorrelated, the effect of white noise on the modulation synchronisation can be drastically reduced.

The bipolar phase rotation signal is multiplied with the gated error impulses, and the resulting signal is integrated and fed to internal synchronisation control means. This is arranged to receive the resulting signal and to use the signal to control a clock timing signal output from the PM modulation synchronisation means 216 to respective I and Q sample-and-hold circuits 301 and 302 placed at the inputs to the second modulator 59. The timing signal advances or retards the clock signal applied to the sample-and-hold circuits as appropriate to maintain synchronous AM and PM modulation.

Figure 11:
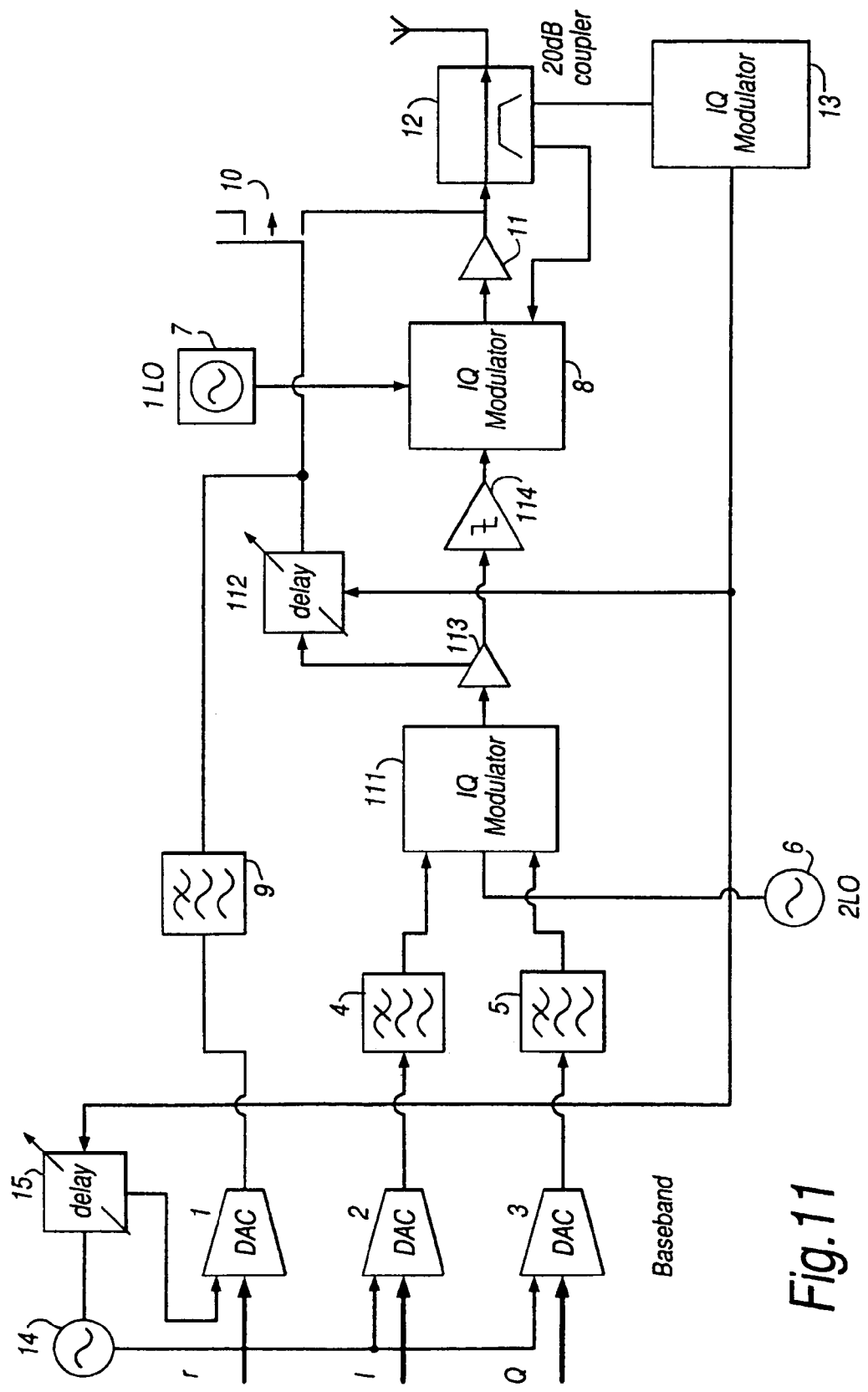
FIG. 11 is a block diagram of a further embodiment of a complete transmitter in accordance with the present invention.

An alternative embodiment of a complete transmitter in accordance with a second aspect of the present invention will now be described with reference to FIG. 11.

Instead of using an IQ modulator in the upconversion loop as in the embodiment of FIG. 2, a separate IQ modulator 111 can be used which converts the IQ components to the IF. The I and Q of the Phase component of the signal is replaced with the baseband signal resolved into I and Q before DACs 2 and 3. The phase component for the PLL is then extracted by a limiter 114 acting at the IF and following the IQ modulator 111. The output of the limiter 114 is connected to an offset PLL 8 with this together with the remainder of the transmit chain exactly as previously shown in FIG. 2. The amplitude envelope of the signal is extracted either at baseband as previously described, or may alternatively be extracted at the IF by means of an envelope detector 113 shown in FIG. 11. Such a detector can be implemented easily at IF in an IC. In this case, the envelope of the IQ signal would have to be predistorted with the known deviations from the general square law of the power amplifier. However, this arrangement has the advantage that the industry standard IQ interface can be used. Apart from this variation in the extraction of the input signal amplitude component, all of the other components are the same as in the embodiment of FIG. 2, and all of the various alternative arrangements for the various modules of the system may be employed as described previously. For example, either of the power efficient amplitude modulation means of FIG. 8 or 9 may be used and similarly the various improvements to the basic PLL design described herein may also be employed.

The present invention therefore provides an efficient linear power amplifier and associated transmitter which is particularly suited for the power efficient transmission of signals which are linearly modulated to provide a non-constant amplitude envelope modulated signal, and which may find application in any system in which non-constant envelope modulated signals are to be employed.

In addition to providing an efficient linear power amplifier and transmitter comprising the various system elements in combination as described above, it will further be understood that the various system components of the present invention can also be considered in isolation and can be used in other systems. In particular, the modulation synchroniser means shown in FIG. 10 could be used in other systems requiring synchronisation between amplitude and phase modulation and is not limited to use in the transmitter of the present invention. Furthermore, the two amplitude modulation circuits shown in FIGS. 8 and 9 are also not limited to use in the transmitter of the present invention and could also be used in other systems. As a result, these components of the present invention could also be considered as separate inventions in themselves.

What is claimed is:

1. A linear RF transmitter for the transmission of non-constant envelope modulated signals comprising:

baseband processing means arranged to resolve an input signal into a phase component, and to further resolve the phase component into In-phase (I) and quadrature (Q) components;

conversion means arranged to generate analogue representations of the signal components;

phase modulation means arranged to receive the analogue representations of the In-phase and quadrature components and to upconvert and phase modulate the I and Q components into an RF signal, further comprising a first oscillator arranged to produce an intermediate frequency signal;

a first IQ modulator means to phase modulate the intermediate frequency signal with the I and Q signal components;

a second oscillator arranged to produce a reference frequency signal; and a phase lock loop to upconvert the modulated intermediate frequency signal to the radio frequency;

said phase modulation means further comprising binary modulator means arranged to receive the phase modulated RF signal and to be controlled by the baseband processing means to remove any 180 degree phase shifts introduced by the phase modulated RF signal;

the upconverted intermediate frequency signal is output as the phase modulated RF signal at a frequency the sum of the intermediate frequency and the reference frequency;

output power amplifier means arranged to receive the phase modulated RF signal and amplify the signal for transmission;

direct amplitude modulation means arranged to receive an amplitude component of the input signal and to control the output power amplifier means in accordance with the amplitude component whereby to amplitude modulate the RF signal; and synchronising means arranged to monitor the RF signal and control the conversion means in response to the RF signal, wherein the baseband processing means are further arranged to resolve the amplitude component from the input signal, and the conversion means are further arranged to generate an analogue representation of the amplitude component and feed the analogue representation to the direct amplitude modulating means.

2. A transmitter according to claim 1, wherein the phase modulation means further comprise:

a first oscillator arranged to produce urn intermediate frequency signal;

a first IQ modulator means to phase modulate the intermediate frequency signal with the I and Q signal components;

an envelope detector means to detect the amplitude component of the phase modulated intermediate frequency signal and to feed the amplitude component to the direct amplitude modulation means;

limiting means to remove the amplitude component from the phase modulated intermediate frequency signal;

a second oscillator arranged to produce a reference signal; and a phase lock loop arranged to receive the limited phase modulated intermediate frequency signal and to upconvert said signal to the radio frequency;

wherein the upconverted intermediate frequency signal is output as the phase modulated RF signal of a frequency the sum of the intermediate frequency and the reference frequency.

3. A linear RF transmitter for the transmission of non-constant envelope modulated signals comprising:

baseband processing means arranged to resolve an input signal into a phase component, and to further resolve the phase component into In-phase (I) and quadrature (Q) components;

conversion means arranged to generate analogue representations of the signal components;

phase modulation means arranged to receive the analogue representations of the In-phase and quadrature components and to upconvert and phase modulate the I and Q components into an RF signal, further comprising a first oscillator arranged to produce an intermediate frequency signal;

a first IQ modulation phase means to phase modulate the intermediate frequency signal with the I and O signal components;

a second oscillator arranged to produce a reference frequency signal; and a phase lock loop to upconvert the intermediate frequency signal to the radio frequency;

the upconverted intermediate frequency signal is output as the phase undulated RF signal at a frequency the sum of the intermediate frequency and the reference frequency;

output power amplifier arranged to receive the phase modulated RF signal and amplify the signal for transmission;

direct amplitude modulation means arranged to receive an amplitude component of the input signal and to control the output power amplifier means in accordance with the amplitude component whereby to amplitude modulate the RF signal;

synchronising means arranged to monitor the RF signal and control the conversion means in response to the RF signal wherein the baseband processing means are further arranged to resolve the amplitude component from the input signal, and the conversion means are further arranged to generate an analogue representation of the amplitude component and feed the analogue representation to the direct amplitude modulating means; and wherein the phase modulation means further comprise:

a second IQ modulator means arranged to receive the phase modulated RF signal and the baseband I and Q components and to further phase modulate the phase modulated RF signal with the baseband I and Q components whereby to remove any unwanted phase modulation introduced into the phase modulated RF signal.

4. A transmitter according to claim 3 wherein the second IQ modulator means are incorporated within the phase lock loop.

5. A transmitter wording to claim 3, wherein both first and second IQ modulator means are incorporated in the feedback path of the PLL.

6. A transmitter according to claim 3, and further comprising phase modulation synchronising means; and respective in-phase and quadrature signal component delay means arranged to control the phase modulating performed in the second IQ modulation means;

wherein said phase modulation synchronising means is arranged to detect phase modulation errors introduced into the phase modulated RF signal and to control the delay means therefrom whereby to reduce modulation synchronisation errors in the phase modulated RF signal.

7. A transmitter according to claim 6, wherein the phase modulation synchronising means is arranged to receive the amplitude component of the input signal, a phase rotation signal from the baseband processing means, and the voltage controlled oscillator control signal from the phase comparison means, and to detect phase modulation errors therefrom.

8. A linear RF transmitter for the transmission of non-constant envelope modulated signals comprising:

baseband processing means arranged to resolve an input signal into a phase component, and to further resolve the phase component into In-phase (I) and quadrature (Q) components;

conversion means arranged to generate analogue representation of the signal components;

phase modulation means arranged to receive the analogue representation of the In-phase and quadrature components and to upconvert and phase modulate the I and Q components into an RF signal, further comprising a first oscillator arranged to produce an intermediate frequency signal;

a first IQ modulator means to phase modulate the intermediate frequency signal with the I and Q signal components;

a second oscillator arranged to produce a reference frequency signal; and a phase lock loop to upconvert the modulated intermediate frequency signal to the radio frequency, further comprising a voltage controlled oscillator;

phase comparison means; and summing and mixing means, wherein the phase comparison means is arranged to receive the phase modulated intermediate frequency signal and a mixed signal output from the mixer means and to control the voltage controlled oscillator therefrom and wherein the voltage controlled oscillator is arranged to output a constant amplitude phase modulated signal in response to the phase comparison means and wherein the summing and mixing means are arranged to sum the constant amplitude phase modulated signal with the RF signal fed back from the output of the output power amplifier means, and mix the resulting signal with the reference frequency signal to generate the mixed signal fed to the phase comparison means;

the unconverted intermediate frequency signal is output as the phase modulated RF signal at a frequency the sum of the intermediate frequency and the reference frequency;

output power amplifier means arranged to receive the phase modulated RF signal and amplify the signal for transmission;

direct amplitude modulation means arranged to receive an amplitude component of the input signal and to control the output power amplifier means in accordance with the amplitude component whereby to amplitude modulate the RF signal; and synchronising means arranged to monitor the RF signal and control the conversion means in response to the RF signal, wherein the phase lock loop further comprises:

summing means disposed between the phase comparison means and the voltage controlled oscillator;

differentiation means arranged to receive the base band component from the baseband processing means and to differentiate the phase component with respect to time, wherein the summing means receives the differentiated phase component and the output from the phase comparison means and steers the voltage controlled oscillator on the basis of the resulting sum.

9. A linear RF transmitter for the transmission of non-constant envelope modulated signals, comprising:

baseband processing means arranged to resolve an input signal into a phase component, and to further resolve the phase component into In-phase (I) and quadrature (Q) components;

conversion means arranged to generate analogue representations of the signal components;

phase modulation means arranged to receive the analogue representation of the In-phase and quadrature components and to upconvert and phase modulate the I and Q components into an RF signal;

output power amplifier means arranged to receive the phase modulated RF signal and amplify the signal for transmission;

direct amplitude modulation means arranged to receive an amplitude component of the input signal and to control the output power amplifier means in accordance with the amplitude component whereby to amplitude modulate the RF signal; and synchronizing means arranged to monitor the RF signal and conversion means in response to the RF signal and wherein the conversion means further comprises:

a separate digital to analogue converter for each of the amplitude component, the In-phase component and the quadrature component of the input signal;

clock means for supplying a clock signal to each of the digital to analogue converters; and conversion control means for controlling the conversion in response to a synchronising control signal from the synchronising means.

10. A transmitter according to claim 9, wherein the conversion control means is a delay circuit arranged to delay the clock signal fed to the digital to analogue converters, whereby to control at least the phase of the generated representations of the input signal components.

11. A transmitter according to claim 9, wherein the conversion means further comprises:

a separate analogue interpolation filter for each of the amplitude component, the In-phase component, and the quadrature component of the input signal, each filter being arranged to receive the respective analogue representations of each input signal component.

12. A linear RF transmitter for the transmission of non-constant envelope modulated signals, comprising:

baseband processing means arranged to resolve an input signal into a phase component and to further resolve the phase component into In-phase (I) and quadrature (Q) components;

conversion means arranged to generate analogue representations of the signal components;

phase modulation means arranged to receive the analogue representations of the In-phase and quadrature components and to upconvert and phase modulate the I and Q components into an RF signal;

output poser amplifier means arranged to receive the phase modulated RF signal and amplify the signal for transmission;

direct amplitude modulation means including power economy means arranged to receive an amplitude component of the input signal and to control the output power amplifier means in accordance with the amplitude component whereby to amplitude modulate the RF signal; and synchronising means arranged to monitor the RF signal and control the conversion means in response to the RF signal; wherein the power economy means comprises:

a first power supply arranged to supply power at a first supply voltage to a first conducting device;

a second power supply arranged to supply power at a second supply voltage to a second conducting device; and switching means arranged to switch between the first and second conducting devices;

wherein the second supply voltage is higher than the first supply voltage, and the switching means is arranged to switch from the first conducting device to the second conducting device when an amplitude peak occurs in the amplitude component of the input signal.

13. A transmitter according to claim 12, wherein the first and second power supplies are each switched mode power supplies.

14. A linear RF transmitter for the transmission of non-constant envelope, modulated signals, comprising:

baseband processing means arranged to resolve an input signal into a phase component and to further resolve the phase component into In-phase (I) and quadrature (Q) components;

conversion means arranged to generate analogue representations the of the signal components:

phase modulation means arranged to receive the analogue representations of the In-phase and quadrature components and to upconvert and phase modulate the I and O components into and RF signal, output power amplifier means arranged to receive the phase modulated RF signal and amplify the signal for transmission;

direct amplitude modulation means including power economy means arranged to receive an amplitude component of the input signal and to control the output power amplifier means in accordance with the amplitude component whereby to amplitude modulate the RF signal; and synchronising means arranged to monitor the RF signal and control the conversion means in response to the RF signal, wherein the power economy means comprises:

a switching device arranged to be controlled by the baseband processing means; and an inductor connected between the power amplifier and the switching device;

wherein the baseband processing means controls the switching device to create a voltage pulse which is integrated by the inductor to give an approximate shape representation of the amplitude component of the input signal.

15. A transmitter according to claim 14, wherein the power economy further comprise:
   a comparator amplifier arranged to operate in a linear manner and arranged to receive the amplitude component of the input signal and the integrated voltage pulse, and output a difference signal therefrom; and
   an adder arranged to receive the integrated voltage pulse and the difference signal and output a sum signal to the power amplifier corresponding to the sum of the two received signals;
   whereby the shape of the voltage pulse may be finely controlled so as to accurately represent the amplitude component of the input signal.

16. A linear RF transmitter for the transmission of non-constant envelope modulated signals, comprising::
   baseband processing means arranged to resolve an input signal two phase components a phase component, and to further resolve the phase components component into In-phase (I) and quadrature (Q) components;
   conversion means arranged to generate analogue representations of the signal components;
   phase modulation means arranged to receive the analogue representations of the In-phase and quadrature components and to upconvert and phase modulate the I and Q components into an RF signal;
   output power amplifier means arranged to receive the phase modulated RF signal and amplify the signal for transmission;
   direct amplitude modulation means arranged to receive an amplitude component of the input signal and to control the output power amplifier means in accordance with the amplitude component whereby, to amplitude modulate time RF signal; and
   synchronising means arranged to monitor the RF signal and control the conversion means in response to the RF signal further comprising:
      phase detector means arranged to detect the phase of the RF output signal;
      amplitude detector means arranged to detect the amplitude envelope at the RF output signal;
      synchronisation detector means arranged to detect the synchronisation between the phase and the amplitude of the RF output signal; and
      synchronization control means arranged to control the conversion means on the basis of the detected synchronization.

17. A transmitter according to claim 16, wherein the phase detractor means further comprises:
   a delay circuit and a mixer arranged to act together as an FM discriminator;
   a first low pass filter arranged to receive the output of the FM discriminator;
   a second low pass filter arranged to receive the output of the FM discriminator; and
   a comparator arranged to receive an output from the first low pass filter and compare this with a reference voltage, the difference being used to control the delay circuit so that the FM discriminator outputs a fixed DC level voltage;
   wherein the fixed DC voltage is manifested as a voltage pulse at the output of the second low pass filter whenever there is a change of phase.

18. A linear RF transmitter for the transmission of non-constant envelope modulated signals, comprising:
   baseband processing means arranged to resolve an input signal into phase components a phase component, and to further resolve the phase components component into In-phase (I) and quadrature (Q) components;
   conversion means arranged to generate analogue representations of the signal components;
   phase modulation means arranged to receive the analogue representations of the In-phase and quadrature components and to upconvert and phase modulate the I and Q components into an RF signal;
   output power amplifier means arranged to receive the phase modulated RF signal and amplify the signal for transmission;
   direct amplitude modulation means, arranged to receive an amplitude component of the input signal and to control the output power amplifier means in accordance with the amplitude component whereby to amplitude modulate the RF signal; and
   synchronising means arranged to monitor the RF signal and control the conversion means in response to the RF signal,
   wherein the baseband processing means are further arranged to resolve the amplitude component from the input signal, and the conversion means are further arranged to generate an analogue representation of the amplitude component and feed the analogue representation to the direct amplitude modulating means;
   wherein the amplitude detector means further comprises and envelope detector for detecting the amplitude envelope; and
   a differentiator arranged to receive the output of the envelope detector and differentiate the signal with respect to time; and
   wherein the synchronisation detector comprises a sampling gate arranged to sample the differentiated amplitude envelope in response to the voltage pulse from the phase detector whereby when the amplitude and phase of the RF signal are synchronous, the sampled signal will be zero.

* * * * *